(12) United States Patent
Wang

(10) Patent No.: US 11,895,902 B2
(45) Date of Patent: Feb. 6, 2024

(54) DISPLAY DEVICE WITH DEVICE BOARD AND MANUFACTURING METHOD THEREOF

(71) Applicant: Wuhan China Star Optoelectronics Semiconductor Display Technology Co., Ltd., Wuhan (CN)

(72) Inventor: Lei Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 831 days.

(21) Appl. No.: 16/957,386

(22) PCT Filed: Apr. 9, 2020

(86) PCT No.: PCT/CN2020/084054
§ 371 (c)(1),
(2) Date: Jun. 24, 2020

(87) PCT Pub. No.: WO2021/189541
PCT Pub. Date: Sep. 30, 2021

(65) Prior Publication Data
US 2023/0098025 A1    Mar. 30, 2023

(30) Foreign Application Priority Data

Mar. 26, 2020    (CN) .......................... 202010223420.1

(51) Int. Cl.
*H10K 71/00*    (2023.01)
*H10K 50/86*    (2023.01)
*H10K 59/12*    (2023.01)

(52) U.S. Cl.
CPC .......... *H10K 71/00* (2023.02); *H10K 50/865* (2023.02); *H10K 59/12* (2023.02); *H10K 59/1201* (2023.02)

(58) Field of Classification Search
None
See application file for complete search history.

(56) References Cited

U.S. PATENT DOCUMENTS

2002/0130992 A1    9/2002  Huang
2005/0012975 A1*   1/2005  George ................. B81B 3/0005
                                                          438/48

(Continued)

FOREIGN PATENT DOCUMENTS

CN         103700685        4/2014
CN         103996696        8/2014

(Continued)

*Primary Examiner* — Nduka E Ojeh
(74) *Attorney, Agent, or Firm* — PV IP PC; Wei Te Chung; Zhigang Ma

(57) ABSTRACT

The present invention provides a display device and a manufacturing method thereof, including: forming a device board; forming a color resist layer on the device board; forming a black matrix layer on the device board, wherein at least a portion of the color resist blocks is defined in a grid region in the black matrix layer, and at least a portion of an orthographic projection of the color resist blocks on the device board covers at least a portion of an orthographic projection of an adjacent part of the black matrix layer on the device board; and forming a planarization layer covering the color resist blocks and the black matrix layer.

16 Claims, 3 Drawing Sheets

(56) References Cited

U.S. PATENT DOCUMENTS

| | | | | |
|---|---|---|---|---|
| 2007/0184363 | A1* | 8/2007 | Kim | G02F 1/133512 |
| | | | | 430/7 |
| 2011/0049444 | A1* | 3/2011 | Sako | C09B 69/04 |
| | | | | 252/586 |
| 2017/0084623 | A1* | 3/2017 | Sharangpani | H01L 27/0207 |
| 2017/0169760 | A1* | 6/2017 | Kim | H10K 59/1213 |
| 2017/0309844 | A1* | 10/2017 | Saeki | G03F 7/11 |
| 2019/0081109 | A1* | 3/2019 | Zhang | H10K 59/126 |

FOREIGN PATENT DOCUMENTS

| | | |
|---|---|---|
| CN | 106229425 | 12/2016 |
| CN | 106920901 | 7/2017 |
| CN | 110112328 | 8/2019 |

\* cited by examiner

DISPLAY DEVICE WITH DEVICE BOARD AND MANUFACTURING METHOD THEREOF

RELATED APPLICATIONS

This application is a National Phase of PCT Patent Application No. PCT/CN2020/084054 having International filing date of Apr. 9, 2020, which claims the benefit of priority of Chinese Patent Application No. 202010223420.1 filed on Mar. 26, 2020. The contents of the above applications are all incorporated by reference as if fully set forth herein in their entirety.

FIELD AND BACKGROUND OF THE INVENTION

The present invention is related to the field of display technology, and specifically, to a display device and a manufacturing method thereof.

Using a color filter (CF) to replace a polarizer (POL) is called polarizer-less (POL-less) technology. It not only reduces a thickness of a functional layer from about 100 microns to less than 5 microns but increases a light extraction rate from 42% to 60%. The POL-less technology based on the color filter is considered to be one of key technologies to realize development of dynamic bending products.

Currently, a traditional manufacturing method of a color filter is to form a black matrix (BM) on a substrate as a bank layer, so that inkjet printing can be accurately aligned. However, in order to realize accurate printing, it is still necessary to process a surface of the bank layer to form a hydrophobic structure. This method has a complicated manufacturing process and low production efficiency.

Therefore, it is necessary to propose a new technical solution to solve the above technical problems.

SUMMARY OF THE INVENTION

Embodiments of the present invention provide a display device and a manufacturing method thereof, which are used to simplify a manufacturing process of a color filter in a display device.

An embodiment of the present invention provides a manufacturing method of a display device including:
  step A: forming a device board;
  step B: forming a color resist layer on the device board, wherein color resist blocks in the color resist layer are arranged in an array;
  step C: forming a black matrix layer on the device board, wherein at least a portion of the color resist blocks is defined in a grid region in the black matrix layer, and at least a portion of an orthographic projection of the color resist blocks on the device board covers at least a portion of an orthographic projection of an adjacent part of the black matrix layer on the device board; and
  step D: forming a planarization layer covering the color resist blocks and the black matrix layer.

In the manufacturing method of the display device provided by an embodiment of the present invention, step B includes:
  forming the color resist layer by a color resist material, wherein the color resist material is selected from the group consisting of a color filter material, a fluorescent material, and a quantum dot material.

In the manufacturing method of the display device provided by an embodiment of the present invention, step B includes:
  forming the color resist layer of uniform by at least one spray coating process, wherein a thickness of the color resist layer ranges from 1 to 4 microns, and a volume of the color resist material corresponding to each of the color resist blocks ranges from 1 to 10 picoliters.

In the manufacturing method of the display device provided by an embodiment of the present invention, step C includes:
  forming a light-shielding material layer; and
  processing the light-shielding material layer to form a patterned black matrix layer.

After step B, the manufacturing method of the display device provided by an embodiment of the present invention further includes:
  modifying a surface of the device board to form a hydrophilic device board.

In the manufacturing method of the display device provided by an embodiment of the present invention, step A includes:
  forming a thin-film transistor array substrate;
  forming sub-pixel units on the thin-film transistor array substrate, wherein each of the sub-pixel units includes a cathode, an organic light-emitting layer, and an anode; and
  forming an encapsulation layer on the sub-pixel units.

In the manufacturing method of the display device provided by an embodiment of the present invention, step B includes:
  forming the color resist blocks on the encapsulation layer of the device board corresponding to the sub-pixel units.

After step A, the manufacturing method of the display device provided by an embodiment of the present invention further includes:
  forming a hydrophobic thin-film layer on the device board.

In the manufacturing method of the display device provided by an embodiment of the present invention, material of the hydrophobic thin-film layer includes at least one of an aluminum oxide superhydrophobic thin-film material, a polyvinyl alcohol superhydrophobic thin-film material, or a polystyrene superhydrophobic thin-film material.

In the manufacturing method of the display device provided by an embodiment of the present invention, step A includes:
  providing a substrate.

In the manufacturing method of the display device provided by an embodiment of the present invention, a thickness of the black matrix layer is greater than or equal to a thickness of the color resist blocks.

An embodiment of the present invention provides a display device including:
  a device board;
  a color resist layer, wherein color resist blocks in the color resist layer are arranged in an array on the device board;
  a black matrix layer disposed on the device board, wherein at least a portion of the color resist blocks is defined in a grid region in the black matrix layer, at least a portion of an orthographic projection of the color resist blocks on the device board covers at least a portion of an orthographic projection of an adjacent part of the black matrix layer on the device board, and the color resist layer is formed before the black matrix layer is formed; and
  a planarization layer covering the color resist blocks and the black matrix layer.

In the display device provided by an embodiment of the present invention, the device board includes:

a thin-film transistor array substrate;

sub-pixel units disposed on the thin-film transistor array substrate; and an encapsulation layer disposed on the sub-pixel units, wherein each of the sub-pixel units includes a cathode, an organic light-emitting layer, and an anode.

In the display device provided by an embodiment of the present invention, the color resist blocks are disposed corresponding to the sub-pixel units.

In the display device provided by an embodiment of the present invention, a thickness of the black matrix layer is greater than or equal to a thickness of the color resist blocks.

In the display device provided by an embodiment of the present invention, the device board includes a transparent glass substrate or a flexible substrate.

In the display device provided by an embodiment of the present invention, the color resist layer is formed by at least one spray coating process, a thickness of the color resist layer ranges from 1 to 4 microns, and a volume of the color resist material corresponding to each of the color resist blocks ranges from 1 to 10 picoliters.

The display device provided by an embodiment of the present invention further includes:

a hydrophobic thin-film layer disposed on the device board.

In the display device provided by an embodiment of the present invention, material of the hydrophobic thin-film layer includes at least one of an aluminum oxide superhydrophobic thin-film material, a polyvinyl alcohol superhydrophobic thin-film material, or a polystyrene superhydrophobic thin-film material.

In the display device and the manufacturing method thereof provided by the embodiments of the present invention, a method of forming the black matrix layer after forming the color resist blocks on the device board is no need to consider a problem of poor adhesion between the color resist blocks and the black matrix layer and simplifies a manufacturing process of a color filter in the display device.

At the same time, the color resist blocks are formed by a multilayer coating method to ensure uniformity of the formed color resist blocks.

BRIEF DESCRIPTION OF THE SEVERAL VIEW OF THE DRAWINGS

In order to further understand the above characteristics and technical aspects of the present invention, please refer to the following detailed description and drawings of the present invention. However, the drawings are only for reference and description, and are not intended to limit the present invention.

FIG. 1 is a flowchart of a manufacturing method of a display device provided by an embodiment of the present invention.

FIGS. 2, 3 and are structural diagrams of the manufacturing method of the display device provided by an embodiment of the present invention.

DESCRIPTION OF SPECIFIC EMBODIMENTS OF THE INVENTION

Figure 1:
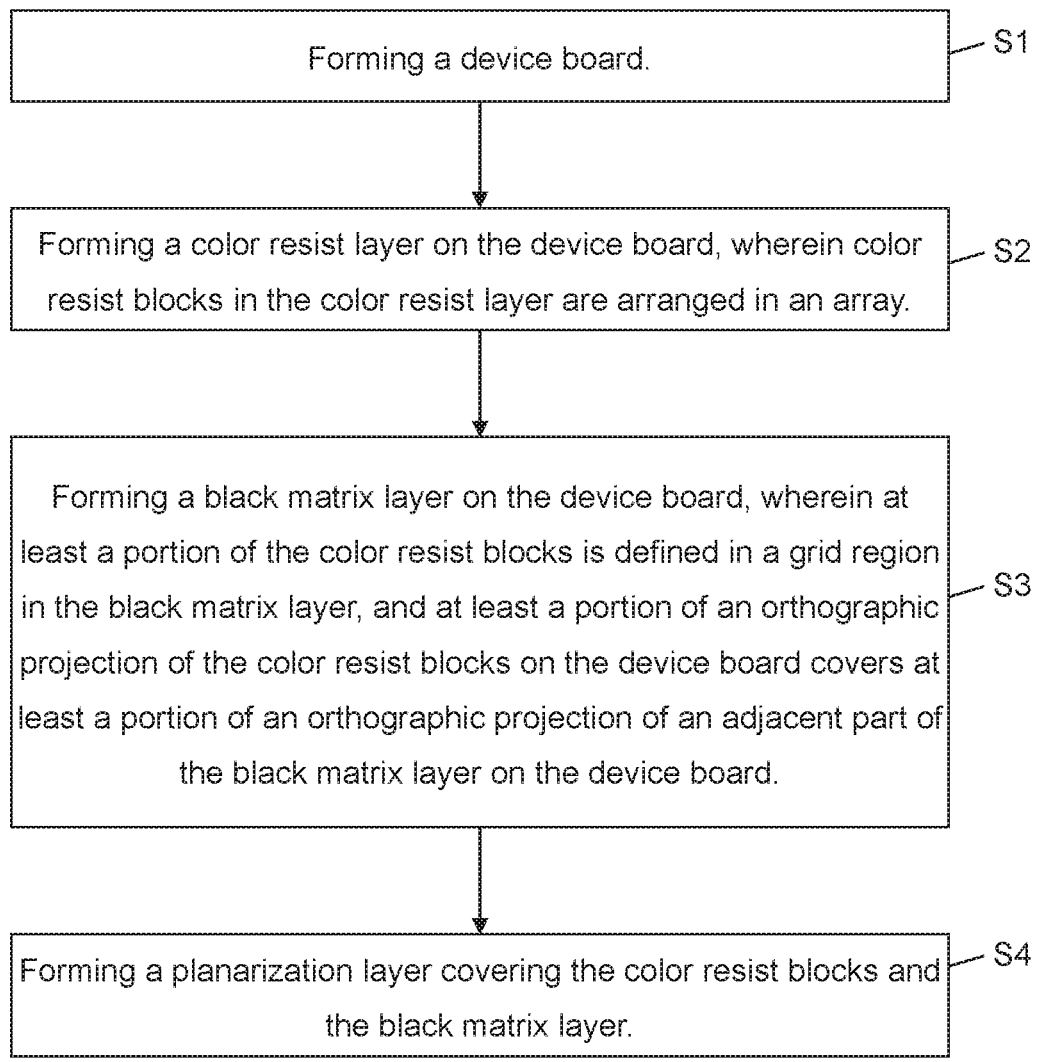

In order to make purposes, technical solutions, and advantages of the present invention clearer, the present invention is further described in detail below with reference to the drawings. Please refer to drawings, units of the same or similar functions are using the same or similar numeral to represent. Embodiments reference to the appended drawings are used to describe and understand the present invention, not to limit the present invention. The term "embodiment" as used in this specification is intended to be used as an example or illustration. In addition, the article "a/an" as used in this specification and the appended claims may generally be construed to mean "one or more" unless otherwise specified or directed from the context clearly to the singular.

With reference to FIGS. 1, 2, 3, and 4, a manufacturing method of a display device provided by an embodiment of the present invention includes the followings.

Step S1: forming a device board 10.

The device board 10 includes a thin-film transistor array substrate 110, sub-pixel units, and an encapsulation layer 130. Each of the sub-pixel units includes a cathode 121, an organic light-emitting layer 122, and an anode 123. The thin-film transistor array substrate 110 includes a substrate, a buffer layer, a semiconductor layer, an insulating layer, a gate, a source, a drain, a passivation layer, a pixel defining layer, etc.

Optionally, the device board 10 includes a substrate 140. Material of the substrate 140 includes a transparent glass substrate and a flexible substrate, etc.

Step S2: forming a color resist layer 20 on the device board 10, wherein color resist blocks 210 in the color resist layer 20 are arranged in an array.

Step S3: forming a black matrix layer 30 on the device board 10, wherein at least a portion of the color resist blocks 210 is defined in a grid region in the black matrix layer 30, and at least a portion of an orthographic projection of the color resist blocks 210 on the device board 10 covers at least a portion of an orthographic projection of an adjacent part of the black matrix layer 30 on the device board 10.

Step S4: forming a planarization layer 40 covering the color resist blocks 210 and the black matrix layer 30.

Specifically, in a manufacturing method of an organic light-emitting diode display device, step S1 includes: forming the thin-film transistor array substrate 110; forming the sub-pixel units on the thin-film transistor array substrate 110, wherein each of the sub-pixel units includes the cathode 121, the organic light-emitting layer 122, and the anode 123; and forming the encapsulation layer 130 on the sub-pixel units. The thin-film transistor array substrate 110 includes the substrate, the buffer layer, the semiconductor layer, the insulating layer, the gate, the source, the drain, the passivation layer, the pixel defining layer, etc.

Figure 2:
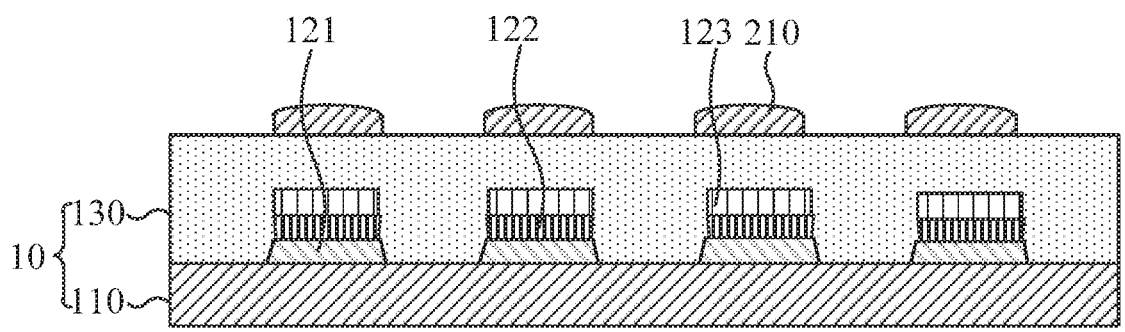

As shown in FIG. 2, step S2 includes: forming the color resist layer 20 by at least one spray coating process, wherein a thickness of the color resist layer ranges from 1 to 4 microns, and a volume of a color resist material corresponding to each of the color resist blocks 210 ranges from 1 to 10 picoliters. Specifically, the color resist material is coated on the device board 10 by using a spray coating process such as an inkjet printing method, a spin coating method, or a blade coating method to form the color resist blocks 210. For example, when the color resist material is applied for a first time, a color resist material corresponding to forming a color resist block 210 having a volume of V1 is coated on a surface of the device board 10 at a spinning speed ranging from 2500 to 3500 rpm, and a spinning time ranges from 10 to 60 seconds. When the color resist material is applied for a second time, a color resist material corresponding to forming a color resist block 210 having a volume of V2 is coated on the surface of the device board 10 at a spinning speed ranging from 2500 to 3500 rpm, and a spinning time ranges from 10 to 60 seconds. When the color resist material is applied for a n-th time, a color resist material corresponding to forming a color resist block 210 having a volume of Vn is coated on a surface of the device board 10 at a spinning speed ranging from 2500 to 3500 rpm, and a spinning time ranges from 10 to 60 seconds. A sum of V1 and V2 to Vn is the volume of the color resist material required to form a color resist block 210, and the volume of any one of V1 and V2 to Vn ranges from 1 to 10 picoliters. The thickness of the color resist block 210 in the color resist layer 20 ranges from 1 to 4 microns. The color resist material for forming the color resist layer 20 is selected from the group consisting of a color filter material, a fluorescent material, and a quantum dot material. Optionally, an embodiment of the present invention includes manufacturing the color resist layer 20 by using a color resist material having a low boiling point of solvent and a fast curing speed.

Optionally, step S2 further includes: forming the color resist blocks 210 on the encapsulation layer 130 of the device board 10 corresponding to the sub-pixel units. Furthermore, scattering particles are formed on the color resist blocks 210, and when light emitted by the organic light-emitting layer 122 passes through the color resist blocks 210, it is scattered by the scattering particles. On the one hand, uniformity of the light emitted by the organic light-emitting layer 122 after passing through the color resist blocks 210 can be further increased, so that the display device is less prone to a phenomenon of darkening at pixel edges, and display uniformity is increased. On the other hand, after the light scattering by the scattering particles, a color shift phenomenon of the display device under different display viewing angles can also be improved, thereby further improving display capability.

Furthermore, after step S2, an embodiment of the present invention further includes modifying a surface of the device board 10 to form a hydrophilic device board 10. Specifically, a lithography mask is placed on the device board 10 after forming the color resist blocks 210, and an exposure process is performed on a position corresponding to the black matrix layer 30. The position corresponding to the black matrix layer 30 is modified with laser light of a specific wavelength emitted by a laser device to form the hydrophilic device board 10.

Figure 3:
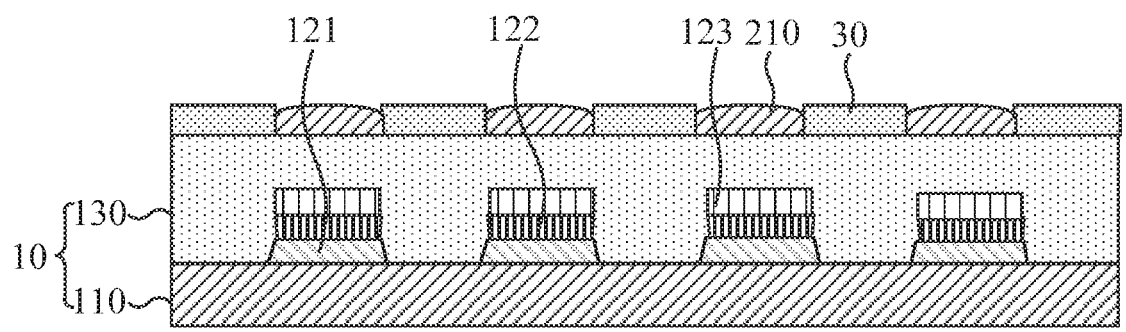

As shown in FIG. 3, step S3 includes: forming a light-shielding material layer and processing the light-shielding material layer to form a patterned black matrix layer 30. Specifically, the light-shielding material layer is formed by an organic film forming process such as slit coating, screen printing, spin coating, inkjet printing, or cast film forming. The matrix layer 30 is patterned by exposure, development, etching and other processes. If material of the matrix layer 30 is a black inorganic thin-film, step S3 can use sputtering, thermal evaporation, chemical vapor deposition (CVD), or physical vapor deposition (PVD) to obtain the black matrix layer 30, for example, by sputtering a layer of copper sulfide to form the black matrix layer 30. The material of the black matrix layer 30 includes black organic resin and a black inorganic thin-film material. The black inorganic thin-film material includes metal oxides and metal sulfides, such as copper oxide CuO, iron oxide $Fe_2O_3$, manganese dioxide $MnO_2$, iron(II,III) oxide $Fe_3O_4$, molybdenum sulfide MoS, copper sulfide CuS, and other relatively stable metal oxides and metal sulfide. Furthermore, a thickness of the black matrix layer 30 is greater than or equal to a thickness of the color resist blocks 210. The thickness of the black matrix layer 30 ranges from 1 to 8 microns, and a preferred thickness ranges from 1 to 5 microns, which is determined to prevent color mixing from occurring between adjacent color resist blocks 210.

Optionally, in an embodiment of the present invention, a manufacturing method of the black matrix layer 30 further includes the spray coating process such as the inkjet printing method, the spin coating method, or the blade coating method. Specifically, a cover layer is disposed on the device board 10 on which the color resist block 210 is formed, the cover layer covers the color resist blocks 210, and a position where the color resist block is not formed on the device board 10 is not covered by the cover layer. For example, when a light-shielding material is applied for a first time, a light-shielding material corresponding to forming a light-shielding material layer having a volume of L1 is coated on a surface of the device board 10 not covered by the cover layer at a spinning speed ranging from 2500 to 3500 rpm, and a spinning time ranges from 10 to 60 seconds. When the light-shielding material is applied for a second time, a light-shielding material corresponding to forming a light-shielding material layer having a volume of L2 is coated on a surface of the device board 10 not covered by the cover layer at a spinning speed ranging from 2500 to 3500 rpm, and a spinning time ranges from 10 to 60 seconds. When the light-shielding material is applied for a n-th time, a light-shielding material corresponding to forming a light-shielding material layer having a volume of Ln is coated on a surface of the device board 10 not covered by the cover layer at a spinning speed ranging from 2500 to 3500 rpm, and a spinning time ranges from 10 to 60 seconds. A sum of L1 and L2 to Ln is a volume of the light-shielding material required to form a light-shielding material layer, and the volume of any one of L1 and L2 to Ln ranges from 1 to 20 picoliters. A thickness of the light-shielding material layer ranges from 1 to 8 microns.

Figure 4:
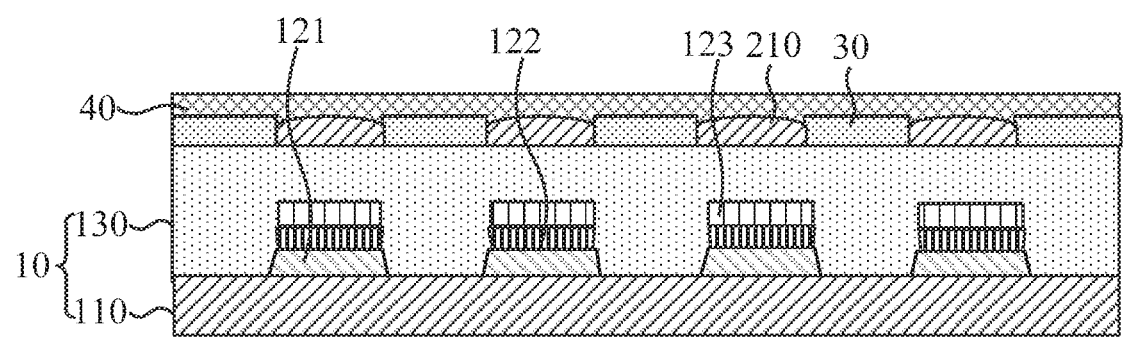

Please refer to FIG. 4, step S4 includes: forming the planarization layer 40 by chemical vapor deposition technology, plasma enhanced chemical vapor deposition (PECVD) technology, atomic layer deposition (ALD) technology, or a sputtering process. Material of the planarization layer 40 includes inorganic thin-film materials such as silicon oxide, silicon nitride, or aluminum oxide, and an elastic resin material which is selected from the group consisting of phenol-based resin, polypropylene-based resin, polyimide-based resin, and acrylic-based resin. A thickness of the planarization layer 40 ranges from 500 to 5000 nm.

In an embodiment of the present invention, the color resist layer 20 is formed by the color resist material. The color resist material includes a color filter material, a fluorescent material, and a quantum dot material.

Figure 5:
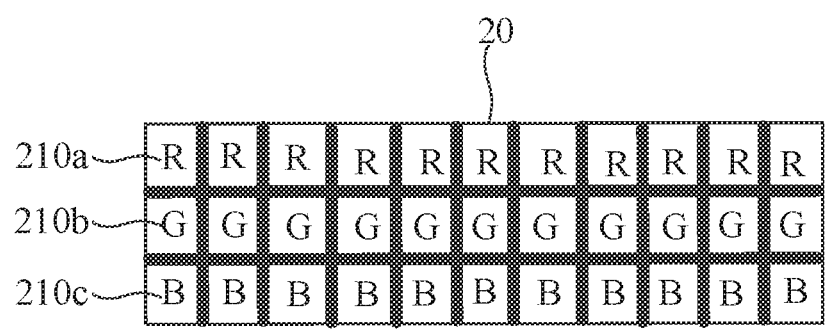
FIG. 5 is a top-view diagram of a color resist layer and a black matrix layer in the manufacturing method of the display device provided by an embodiment of the present invention.

Specifically, referring to FIG. 5, red (R) color resist blocks 210*a* can be formed in a first row, green (G) color resist blocks 210*b* can be formed in a second row, and blue (B) color resist blocks 210*c* can be formed in a third row. The black matrix layer 30 is used to prevent light emitted from the color resist blocks 210 of different colors between different rows from leaking out and causing color mixing. It should be explained that an order of forming the color resist blocks 210 of different colors can be changed, and sizes of the color resist blocks 210 of different colors are not limited. The color filter material includes at least one of a red filter material, a green filter material, or a blue filter material. The fluorescent material includes at least one of a red fluorescent material, a green fluorescent material, or a blue fluorescent material. The quantum dot material includes at least one of a red-emitting quantum dot material, a green-emitting quantum dot material, or a blue-emitting quantum dot material.

It should be explained that, in an embodiment of the present invention, a shape of the black matrix layer 30 is not limited.

Figure 6:
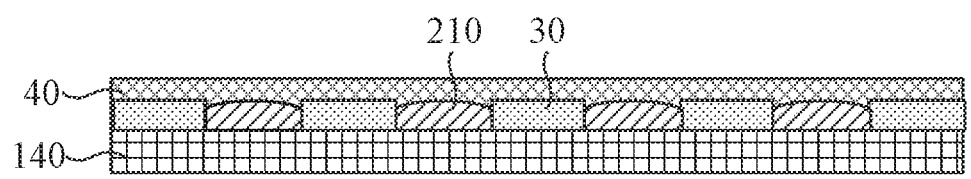
FIG. 6 is a structural diagram of another display device provided by an embodiment of the present invention.

Optionally, as shown in FIG. 6, in a manufacturing method of another display device, step S1 includes: providing a substrate 140. Material of the substrate 140 includes a transparent glass substrate and a flexible substrate.

Next, the manufacturing method of another display device includes: forming a color resist layer 20 on the substrate 140, wherein color resist blocks 210 in the color resist layer 20 are arranged in an array; forming a black matrix layer 30 on the substrate 140, wherein at least a portion of the color resist blocks 210 is defined in a grid region in the black matrix layer 30, and at least a portion of an orthographic projection of the color resist blocks 210 on the substrate 140 covers at least a portion of an orthographic projection of an adjacent part of the black matrix layer 30 on the substrate 140; forming a planarization layer 40 covering the color resist blocks 210 and the black matrix layer 30.

Figure 7:
FIG. 7 is a structural diagram of a manufacturing method of a hydrophobic film layer in the display device provided by an embodiment of the present invention.

Optionally, as shown in FIG. 7, in an embodiment of the present invention, after the device board 10 is formed, a hydrophobic thin-film layer 11 is formed on the device board 10. Material of the hydrophobic thin-film layer 11 includes at least one of an aluminum oxide superhydrophobic thin-film material, a polyvinyl alcohol superhydrophobic thin-film material, a polystyrene superhydrophobic thin-film material, or the like. A contact angle between the hydrophobic thin-film layer 11 and a water surface is greater than 90 degrees. Preferably, the contact angle is greater than 150 degrees.

An embodiment of the present invention also provides a display device. The display device includes adopting the above manufacturing method of the display device.

Specifically, as shown in drawings, the display device includes:
a device board 10, wherein the device board 10 includes: a thin-film transistor array substrate 110, sub-pixel units, and an encapsulation layer 130, the sub-pixel units are disposed on the thin-film transistor array substrate 110, the encapsulation layer 130 is disposed on the sub-pixel units, and each of the sub-pixel units includes a cathode 121, an organic light-emitting layer 122, and an anode 123;
a color resist layer 20 disposed on the encapsulation layer 130 and including at least one color resist block 210;
a black matrix layer 30 disposed between the color resist blocks 210, wherein at least a portion of the color resist blocks 210 is defined in a grid region in the black matrix layer 30, and at least a portion of an orthographic projection of the color resist blocks 210 on the device board 10 covers at least a portion of an orthographic projection of an adjacent part of the black matrix layer 30 on the device board 10; and
a planarization layer 40 disposed on the color resist blocks 210 and the black matrix layer 30.

Optionally, in an embodiment of the present invention, the color resist blocks 210 are disposed corresponding to the sub-pixel units.

Compared with the prior art, in the display device and the manufacturing method thereof provided by the embodiments of the present invention, a method of forming the black matrix layer after forming the color resist blocks on the device board is no need to consider a problem of poor adhesion between the color resist blocks and the black matrix layer and simplifies a manufacturing process of a color filter in the display device.

At the same time, the color resist blocks are formed by a multilayer coating method to ensure uniformity of the formed color resist blocks.

Although the present invention has been disclosed above with the preferred embodiments, it is not intended to limit the present invention. Persons having ordinary skill in this technical field can still make various alterations and modifications without departing from the scope and spirit of this invention. Therefore, the scope of the present invention should be defined and protected by the following claims and their equivalents.

What is claimed is:

1. A manufacturing method of a display device, comprising:
    step A: forming a device board;
    step B: forming a color resist layer on the device board, wherein color resist blocks in the color resist layer are arranged in an array; wherein a thickness of the color resist layer ranges from 1 to 4 microns;
    step B.1: modifying a surface of the device board with a laser to form a hydrophilic device board:
    step C: forming a black matrix layer on the hydrophilic device board; and
    step D: forming a planarization layer covering the color resist blocks and the black matrix layer.

2. The manufacturing method of the display device according to claim 1, wherein step B comprises:
    forming the color resist layer by a color resist material, wherein the color resist material is selected from the group consisting of a color filter material, a fluorescent material, and a quantum dot material.

3. The manufacturing method of the display device according to claim 1, wherein step B comprises:
    forming the color resist layer uniformly by at least one spray coating process, wherein a volume of the color resist material corresponding to each of the color resist blocks ranges from 1 to 10 picoliters.

4. The manufacturing method of the display device according to claim 1, wherein step C comprises:
    forming a light-shielding material layer; and
    processing the light-shielding material layer to form a patterned black matrix layer.

5. The manufacturing method of the display device according to claim 1, wherein step A comprises:
    forming a thin-film transistor array substrate;
    forming sub-pixel units on the thin-film transistor array substrate, wherein each of the sub-pixel units comprises a cathode, an organic light-emitting layer, and an anode; and
    forming an encapsulation layer on the sub-pixel units.

6. The manufacturing method of the display device according to claim 5, wherein step B comprises:
    forming the color resist blocks on the encapsulation layer of the device board corresponding to the sub-pixel units.

7. The manufacturing method of the display device according to claim 1, wherein material of the hydrophobic thin-film layer comprises at least one of an aluminum oxide superhydrophobic thin-film material, a polyvinyl alcohol superhydrophobic thin-film material, or a polystyrene superhydrophobic thin-film material.

8. The manufacturing method of the display device according to claim 1, wherein step A comprises:
providing a substrate.

9. The manufacturing method of the display device according to claim 1, wherein a thickness of the black matrix layer is greater than a thickness of the color resist blocks.

10. A display device, comprising:
a device board; wherein the device board is hydrophilic;
a color resist layer, wherein color resist blocks in the color resist layer are arranged in an array on the device board;
a black matrix layer disposed on the device board, and the color resist layer is formed before the black matrix layer is formed; and
a planarization layer covering the color resist blocks and the black matrix layer;
wherein a thickness of the color resist layer ranges from 1 to 4 microns.

11. The display device according to claim 10, wherein the device board comprises:
a thin-film transistor array substrate;
sub-pixel units disposed on the thin-film transistor array substrate; and
an encapsulation layer disposed on the sub-pixel units, wherein each of the sub-pixel units comprises a cathode, an organic light-emitting layer, and an anode.

12. The display device according to claim 10, wherein the color resist blocks are disposed corresponding to the sub-pixel units.

13. The display device according to claim 10, wherein a thickness of the black matrix layer is greater than a thickness of the color resist blocks.

14. The display device according to claim 10, wherein the device board comprises a transparent glass substrate or a flexible substrate.

15. The display device according to claim 10, wherein the color resist layer is formed by at least one spray coating process, and a volume of the color resist material corresponding to each of the color resist blocks ranges from 1 to 10 picoliters.

16. The display device according to claim 10, wherein material of the hydrophobic thin-film layer comprises at least one of an aluminum oxide superhydrophobic thin-film material, a polyvinyl alcohol superhydrophobic thin-film material, or a polystyrene superhydrophobic thin-film material.

* * * * *